United States Patent
Remington, Jr. et al.

(10) Patent No.: US 7,160,578 B2
(45) Date of Patent: Jan. 9, 2007

(54) METHOD FOR DEPOSITING ALUMINUM OXIDE COATINGS ON FLAT GLASS

(75) Inventors: Michael P. Remington, Jr., Toledo, OH (US); David A. Strickler, Toledo, OH (US); Srikanth Varanasi, Toledo, OH (US)

(73) Assignee: Pilkington North America, Toledo, OH (US)

( * ) Notice: Subject to any disclaimer, the term of this patent is extended or adjusted under 35 U.S.C. 154(b) by 143 days.

(21) Appl. No.: 10/797,426

(22) Filed: Mar. 10, 2004

(65) Prior Publication Data

US 2005/0202169 A1    Sep. 15, 2005

(51) Int. Cl.
*C23C 16/40* (2006.01)

(52) U.S. Cl. ........................ 427/255.31; 427/255.34; 427/255.39; 427/255.7

(58) Field of Classification Search ........... 427/255.31, 427/255.34, 255.39, 255.7
See application file for complete search history.

(56) References Cited

U.S. PATENT DOCUMENTS

| | | | |
|---|---|---|---|
| 2,805,965 A | | 9/1957 | Robinson |
| 3,639,458 A | * | 2/1972 | Etherington et al. ........ 560/214 |
| 3,847,643 A | | 11/1974 | Hammer et al. |
| 4,129,434 A | | 12/1978 | Plumat et al. |
| 4,160,061 A | | 7/1979 | Okino et al. |
| 4,180,400 A | * | 12/1979 | Smith et al. ................... 75/235 |
| 4,308,316 A | | 12/1981 | Gordon |
| 4,321,073 A | * | 3/1982 | Blair ............................ 65/446 |
| 4,675,089 A | * | 6/1987 | Lory et al. ................... 204/164 |
| 4,842,775 A | * | 6/1989 | Okada et al. ................ 552/307 |
| 4,946,712 A | * | 8/1990 | Goodman et al. ........... 427/166 |
| 5,132,196 A | | 7/1992 | Hirayama et al. |
| 5,217,753 A | | 6/1993 | Goodman et al. |
| 5,244,692 A | | 9/1993 | Zagdoun et al. |
| 5,256,485 A | | 10/1993 | Terneu et al. |
| 5,374,570 A | | 12/1994 | Nasu et al. |
| 5,540,777 A | | 7/1996 | Barbee et al. |
| 5,648,113 A | | 7/1997 | Barbee et al. |
| 5,665,608 A | | 9/1997 | Chapple-Sokol et al. |
| 5,728,222 A | | 3/1998 | Barbee et al. |
| 5,776,603 A | | 7/1998 | Zagdoun et al. |
| 5,922,405 A | | 7/1999 | Kim et al. |
| 5,980,983 A | | 11/1999 | Gordon |
| 6,037,003 A | | 3/2000 | Gordon et al. |
| 6,309,427 B1 | | 10/2001 | Korte |
| 6,362,414 B1 | * | 3/2002 | Fujisawa et al. ............. 136/256 |
| 6,426,307 B1 | | 7/2002 | Lim |
| 6,495,709 B1 | | 12/2002 | Celinska et al. |
| 6,664,186 B1 | | 12/2003 | Callegari et al. |
| 6,838,179 B1 | | 1/2005 | Legrand |
| 2001/0006835 A1 | | 7/2001 | Kim et al. |
| 2002/0001969 A1 | | 1/2002 | Jang et al. |
| 2002/0106451 A1 | | 8/2002 | Skarp et al. |
| 2003/0039843 A1 | * | 2/2003 | Johnson et al. ............. 428/432 |
| 2005/0202170 A1 | * | 9/2005 | Remington et al. ...... 427/248.1 |

FOREIGN PATENT DOCUMENTS

| | | |
|---|---|---|
| EP | 0 460 254 A1 | 12/1991 |
| EP | 0 997 551 A2 | 5/1996 |
| EP | 0 994 080 A1 | 4/2000 |
| EP | 0 712 815 B1 | 5/2000 |
| GB | 835820 | 5/1960 |
| WO | WO 97/20963 | 6/1997 |
| WO | WO 98/16667 | 4/1998 |
| WO | 01/05723 A1 | 1/2001 |

OTHER PUBLICATIONS

Silvestri, et al., Properties of $Al_2O_3$ Films Deposited from the $AlCl_3$, $CO_2$, and $H_2$ System, J. Electrochem. Soc.: - Solid-State Science and Technology, Jun. 1978, vol. 125, pp. 902-907.

Park, et al., The effects of reaction parameters on the deposition characteristics in $Al_2O_3$ CVD, J. Vac. Sci. Technol. A, vol. 1, No. 4, Oct.-Dec. 1983, pp. 1820-1824.

Chemical Vapour Deposition of Aluminium Oxides from Various Gas Mixtures, Journal of Vapor Deposition, vol. 1 - Apr. 1993, (pp. 333-417).

* cited by examiner

*Primary Examiner*—Bret Chen
(74) *Attorney, Agent, or Firm*—Marshall & Melhorn, LLC

(57) ABSTRACT

A chemical vapor deposition process for laying down an aluminum oxide coating on a glass substrate through the use of an organic ester having a β hydrogen on the alkyl group bonded to the carboxylate oxygen and an inorganic aluminum halide. The resulting article has an aluminum oxide coating which can be of substantial thickness because of the high deposition rates attainable with the novel process. Preferably, the coating deposition rates resulting from the method of the present invention may be greater than or equal to 200 Å per second.

24 Claims, No Drawings

METHOD FOR DEPOSITING ALUMINUM OXIDE COATINGS ON FLAT GLASS

BACKGROUND OF THE INVENTION

1. Field of the Invention

This invention relates to a process for depositing aluminum oxide coatings on a flat glass substrate. More particularly, this invention relates to an atmospheric pressure chemical vapor deposition process for producing aluminum oxide coatings at high growth rates on flat glass using a coating precursor gas mixture comprising an inorganic aluminum halide and an organic ester having a β hydrogen on the alkyl group bonded to the carboxylate oxygen.

2. Summary of Related Art

Due to a number of desirable physical and chemical properties, aluminum oxide coatings have been used, primarily, in connection with diffusion barriers for species such as alkali metal cations, oxygen and water, passivation layers in microelectronic devices, wear resistant coatings, and corrosion-resistant coatings.

Growth of aluminum oxide coatings by CVD has been reported in the scientific literature. Deposition from $AlCl_3$ has been performed under atmospheric pressure (and low pressure) conditions using $CO_2$ and $H_2$ as a hydrolysis source (Silvestri et al., *J. Electrochem. Soc.* 1978, 125, 902 and Park et al., *J. Vac. Sci. Technol. A* 1983, 1, 1820). Deposition was carried out at 700–900° C. and produced low film growth rates between 0.2 and 2.2 Å/sec.

Highly reactive organometallic precursors such as alkyl aluminum compounds, $R_3Al$, have been used to grow aluminum oxide coatings. Other methods use alkoxides such as $Al(OR)_3$, or mixtures of both alkyl aluminum and aluminum alkoxides, i.e., $[R_3Al_2(OR)_3]$, and adducts of alane, $D:AlH_3$ where D is a Lewis base. Other less used aluminum oxide precursors have been aluminum-based esters, for example, $[Al(OOCR)_3]$, $Al(N(TMS)_2)_3$, where TMS is trimethylsilyl, and $Al(BH_4)_3$. Each of the above-described chemistries has certain drawbacks with low growth rates dominating the results.

Deposition of aluminum oxide films has also been disclosed in the patent literature. For example, U.S. Pat. No. 2,805,965 describes a process for applying a film of a metal compound to a surface. The patent states the vapors of an organic hydroxy salt of, for example, aluminum, can be used to form a film of aluminum oxide on a surface. In one example, aluminum ethylate is boiled under pressure. The vapors from the aluminum ethylate are fed into a tube through which a copper wire is passed. An electric current is passed through the wire to heat it. As the ethylate vapors reach the wire, a film of aluminum oxide deposits on it.

A process for forming a metal oxide on a substrate is taught in U.S. Pat. No. 4,129,434. According to the patent, a solution of at least one metal compound is applied to the substrate where the solution is a metal acetyl acetonate or a mixture of metal acetyl acetonates. The metal acetyl acetonate solution may include aluminum. The solution can be sprayed onto the glass ribbon located in the drawing chamber of a glass drawing machine, or in an annealing lehr, to form a metal oxide film.

U.S. Pat. No. 4,160,061 teaches dissolving an acetyl acetonate of aluminum in an organic solvent together with at least one similarly decomposable metal compound to form a metal oxide on a substrate. The decomposable metal compound is selected from the compounds of Cr, Co, Ni, Fe, Zn, Sn, Cu, Mn and Ti. In one example, acetyl acetonates of Cr, Co, Fe and Al were dissolved in a mixture of dichloromethane and methanol with various concentrations of aluminum acetyl acetonate. Each solution was sprayed onto a glass substrate and heated in an electric furnace to 630° C. A metal oxide was formed on the glass surface in this manner.

A method for forming an insulating layer on an active matrix display is provided in U.S. Pat. No. 5,374,570. First, a substrate is exposed to an aluminum chloride vapor. This exposure results in a film of the vapor being deposited on the substrate. The substrate is then moved from the aluminum chloride vapor to a water and/or oxygen vapor environment. A film of water and/or oxygen vapor forms on the substrate. The substrate is then moved back to the aluminum chloride vapor where the aluminum chloride is converted to a very thin layer of aluminum oxide on the substrate. This process is repeated thousands of times to form the aluminum oxide layer.

U.S. Pat. No. 5,648,113 discloses a process for chemical vapor deposition of $Al_2O_3$ on a substrate using aluminum tri-isopropoxide (ATI). A source of ATI is heated to a temperature sufficient to provide a flow of chemical vapor through a vapor delivery system. The vapor is combined with a preheated inert gas, such as argon. The vapor and inert gas are injected into the processing chamber where the chemical vapor in the gas mixture reacts on the substrate to form an aluminum oxide film thereon.

It would be desirable to form aluminum oxide films at essentially atmospheric pressure and to produce them at deposition rates compatible with time-critical manufacturing processes, for example, production of flat glass by the well-known float method. Those skilled in the art have continued to search for a method of producing aluminum oxide films meeting the above-noted criteria in order to have available, affordable films for optical thin film stack designs.

SUMMARY OF THE INVENTION

In accordance with the present invention, there is provided a chemical vapor deposition process for laying down an aluminum oxide coating on a hot glass substrate using a precursor gas mixture containing an aluminum halide, an organic ester having a β hydrogen on the alkyl group bonded to the carboxylate oxygen and optionally including molecular oxygen.

Preferably, the present invention provides a process for depositing aluminum oxide coating on a hot glass substrate comprising the steps of:

(a) preparing a precursor gas mixture containing an inorganic aluminum halide and an organic ester having a β hydrogen on the alkyl group bonded to the carboxylate oxygen for formation of aluminum oxide, (b) maintaining said precursor gas mixture at a temperature below the temperature at which the aluminum halide reacts with the ester to form the aluminum oxide while delivering the mixture to a coating chamber opening onto the hot glass, (c) introducing the precursor gas mixture into the coating chamber whereby the mixture is heated to a temperature sufficient to cause reaction of the aluminum halide and the ester to cause deposition of the aluminum oxide, by incorporating oxygen from the ester, onto the hot glass surface.

DESCRIPTION OF THE PREFERRED EMBODIMENT

It has been found that esters having a hydrogen atom in the "β" position of the molecular structure may be used as a source of oxygen, without requiring the presence of water vapor or gaseous oxygen. Preferred are esters having a β hydrogen on the alkyl group bonded to the carboxylate oxygen. By "carboxylate oxygen" is meant that oxygen atom in the basic structure of an ester, which ester is formed by the chemical reaction of carboxylic acid and an alcohol, such that the subject oxygen atom is one bonded to an alkyl group provided by said alcohol.

Organic esters containing 3 to 18 carbon atoms may be used with the invention, however, it is preferred to use organic esters containing from 3 to 6 carbon atoms, since larger molecules tend to be less volatile and hence less convenient for use in the CVD process of the present invention.

Esters useful as precursor materials in connection with the present invention can be described by the following formula:

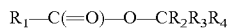

where $R_1$–$R_3$ is H, or a short chain, saturated organic group having 1 to 4 carbon atoms and $R_4$ is a short chain, saturated organic group having 1 to 4 carbon atoms. In the structure illustrated in the formula noted above, a β hydrogen which is useful in connection with the present invention may occupy the β position in the structure of $R_2$, $R_3$ and $R_4$.

Preferred esters for use as sources of oxygen in the practice of the present invention include, ethyl acetate, isobutyl acetate, n-butyl acetate and ethyl formate. A particularly preferred organic source of oxygen is ethyl acetate.

The method of the present invention is generally practiced in connection with the formation of a continuous glass ribbon substrate, for example during a float glass production process. However, the method of the present invention may be employed in coating flat glass substrates in spray pyrolysis coating systems or off-line CVD coating systems.

While it is contemplated that the precuror could be combined at, or very near, the surface of the glass, the present invention preferably involves the preparation of a precursor gas mixture which includes inorganic aluminum chlorides, particularly aluminum trichloride ($AlCl_3$) and an ester. A carrier gas or diluent, for example, nitrogen, air or helium, will normally also be included in the gas mixture. Since thermal decomposition of the ester may initiate the aluminum oxide deposition reaction at a high rate, it is desirable that the precursor mixture be kept at a temperature below the thermal decomposition temperature of the ester to prevent prereaction of the gaseous mixture resulting in formation of the aluminum oxide.

The gaseous mixture is maintained at a temperature below that at which it reacts to form the aluminum oxide, and is delivered to a location near a flat glass substrate to be coated, the substrate being at a temperature above the reaction temperature (and above the decomposition temperature of the ester in the precursor gas mixture).

The precursor gas mixture is thereafter introduced into the vapor space directly over the substrate. The heat from the substrate raises the temperature of the precursor gas above the thermal decomposition temperature of the organic oxygen compound. The ester then decomposes and by reaction with the aluminum chloride, produces an aluminum oxide coating on the substrate.

While the exact role of the organic ester in the deposition of aluminum oxides from aluminum trichloride has not been established, one plausible mechanism is as follows:

1. The ester undergoes an intra-molecular gas phase pyrolytic elimination to give the corresponding carboxylic acid and an olefin.
2. The carboxylic acid produced in step 1 dehydrates intra-molecularly, via further pyrolysis, to provide water and a ketene.
3. The water generated in step 2 then reacts with aluminum chloride to give aluminum oxide via hydrolysis.

If the organic ester first reacts with aluminum trichloride to give a Lewis acid-base complex, it does not necessarily preclude the proposed mechanism (steps 1–3) from taking place.

Also, it has surprisingly been discovered that only certain inorganic main group metal halide compounds such as aluminum halides react at useable rates with esters to deposit metal oxide coatings, while most main group metal halides do not. While not wishing to be bound by any theory, it is believed that such reactivity results from vacancies in certain molecular orbitals in the structure of, for example, aluminum halides.

The present invention permits the production of aluminum oxide coatings deposited on hot glass at a high deposition rate. Preferably, the aluminum oxide coatings are deposited at a rate of over 200 Å/second. High deposition rates are important when coating substrates in a manufacturing process. This is particularly true for an on-line float glass process where the glass ribbon is traveling at a specific line speed on the order of several hundred inches per minute, and where a specific coating thickness is required. The deposition rates obtained with the preferred embodiments of the present invention may be two or more times higher than the deposition rate with other known methods for depositing aluminum oxide coatings. Especially high deposition rates for aluminum oxide may be achieved with the present invention using a precursor mixture including an ester having 3 to 6 carbon atoms.

The deposition rate is dependent upon the particular ester used, and the concentrations of both the ester and the aluminum chloride, as well as the temperature of the glass. For any particular combination of compounds, the optimum concentrations (and in particular the optimum proportion of the ester to aluminum chloride) and flow rates for rapid coating deposition may be determined by simple trial. However, it will be appreciated that the use of higher concentrations of reactants and high gas flow rates is likely to result in a less efficient overall conversion of the reactants into a coating, so that the optimum condition for commercial operation may differ from the conditions which provide the highest deposition rates.

The method of the invention permits the production, at high rates of aluminum oxide coatings on hot flat glass substrates on line during the glass production process. The aluminum oxide coatings produced by the inventive method have been found to have refractive index values in the range of 1.5–1.65, permitting the achievement of desired optical effects, especially when used in combination with other coating layers. The aluminum oxide coatings may be doped, for example with fluorine, if desired. Such fluorine doping may affect certain optical constants of the coating and/or may impart certain properties to the outer surface of the coating, e.g., hydrophobicity, etc.

A float glass installation may be utilized as a means for practicing the method of the present invention. The float glass apparatus more particularly comprises a canal section along which molten glass is delivered from a melting furnace, to a float bath section wherein a continuous glass ribbon is formed in accordance with the well-known float process. The glass ribbon advances from the bath section through an adjacent annealing lehr and a cooling section. The continuous glass ribbon serves as the substrate upon which the aluminum oxide coating is deposited in accordance with the present invention.

The float section includes a bottom section within which a bath of molten tin is contained, a roof, opposite sidewalls, and end walls. The roof, side walls, and end walls together define an enclosure in which a non-oxidizing atmosphere is maintained to prevent oxidation of the molten tin.

Additionally, gas distributor beams are located in the bath section. The gas distributor beams in the bath section may be employed to apply additional coatings onto the substrate prior to applying the aluminum oxide coating by the method of the present invention. The additional coatings may include silicon and silica.

In operation, the molten glass flows along the canal beneath a regulating tweel and downwardly onto the surface of the tin bath in controlled amounts. On the tin bath the molten glass spreads laterally under the influences of gravity and surface tension, as well as certain mechanical influences, and it is advanced across the bath to form the ribbon. The ribbon is removed over lift out rolls and is thereafter conveyed through the annealing lehr and the cooling section on aligned rolls. The application of the coating of the present invention may take place in the float bath section, or further along the production line, for example in the gap between the float bath and the annealing lehr, or in the annealing lehr.

A suitable non-oxidizing atmosphere, generally nitrogen or a mixture of nitrogen and hydrogen in which nitrogen predominates, is maintained in the bath enclosure to prevent oxidation of the tin bath. The atmosphere gas is admitted through conduits operably coupled to a distribution manifold. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. For purposes of the present invention the above-noted pressure range is considered to constitute normal atmospheric pressure. Heat for maintaining the desired temperature regime in the tin bath and the enclosure is provided by radiant heaters within the enclosure. The atmosphere within the lehr is typically atmospheric air, as the cooling section is not enclosed and the glass ribbon is open to the ambient atmosphere. Ambient air may be directed against the glass ribbon as by fans in the cooling section. Heaters may also be provided within the annealing lehr for causing the temperature of the glass ribbon to be gradually reduced in accordance with a predetermined regime as it is conveyed therethrough.

Gas distributor beams are generally, positioned in the float bath to deposit the various coatings on the glass ribbon substrate. The gas distributor beam is one form of reactor that can be employed in practicing the process of the present invention.

A conventional configuration for the distributor beams suitable for supplying the precursor materials in accordance with the invention is generally an inverted generally channel-shaped framework formed by spaced inner and outer walls and defines enclosed cavities. A suitable heat exchange medium is circulated through the enclosed cavities in order to maintain the distributor beams at a desired temperature.

The precursor gas mixture is supplied through a fluid cooled supply conduit. The supply conduit extends along the distributor beam and admits the gas through drop lines spaced along the supply conduit. The supply conduit leads to a delivery chamber within a header carried by the framework. Precursor gases admitted through the drop lines are discharged from the delivery chamber through a passageway toward a coating chamber defining a vapor space opening onto the glass where they flow along the surface of the glass.

Baffle plates may be provided within the delivery chamber for equalizing the flow of precursor materials across the distributor beam to assure that the materials are discharged against the glass in a smooth, laminar, uniform flow entirely across the distributor beam. Spent precursor materials are collected and removed through exhaust chambers along the sides of the distributor beam.

Various forms of distributor beams used for chemical vapor deposition are suitable for the present method and are known in the prior art.

One such alternative distributor beam configuration generally introduces the precursor gas mixture through a gas supply duct where it is cooled by cooling fluid circulated through ducts. Gas supply duct opens through an elongated aperture into a gas flow restrictor.

The gas flow restrictor comprises a plurality of metal strips longitudinally crimped in the form of a sine wave and vertically mounted in abutting relationship with one another extending along the length of the distributor. Adjacent crimped metal strips are arranged "out of phase" to define a plurality of vertical channels between them. These vertical channels are of small cross-sectional area relative to the cross-sectional area of the gas supply duct, so that the gas is released from the gas flow restrictor at substantially constant pressure along the length of the distributor.

The coating gas is released from the gas flow restrictor into the inlet side of a substantially U-shaped guide channel generally comprising an inlet leg, coating chamber which opens onto the hot glass substrate to be coated, and exhaust outlet, whereby used coating gas is withdrawn from the glass. The rounded corners of the blocks defining the coating channel promote a uniform laminar flow of coating parallel to the glass surface across the glass surface to be coated.

The following examples (in which gas volumes are expressed under standard condition, i.e., one atmosphere pressure and ambient temperature, unless other stated) which constitute the best mode presently contemplated by the inventors for practicing the invention, are presented solely for the purpose of further illustrating and disclosing the present invention, and are not to be construed as a limitation on, the invention:

EXAMPLES

Examples 1–8

The following experimental conditions are applicable to Examples 1–8.

A laboratory furnace having a moving conveyor to more a glass sheet, or sheets, through said furnace at a rate of 150 inches/minute (ipm), also contains a single, 10-inch wide, bi-directional coater, the coater being suitable for conveying vaporized reactants to the surface of the glass sheets in order to form a film or film stack by chemical vapor deposition.

The glass sheets are heated to approximately 1170° F., while the coater, at the reactor face, i.e., the portion nearest the glass surface is at a temperature of approximately 500° F.

Total gas flow was essentially 35 standard liters per minute (slm) for all examples except Example 6, which was essentially 32 slm.

Preparation of the various precursor materials is accomplished by utilizing multiple source chambers known as "bubblers", there being one for each of ethyl acetate (EtOAc) and aluminum trichloride ($AlCl_3$) which are maintained at specific temperatures. Helium gas is introduced into the bubbler, at a particular flow rate. Alternatively, the EtOAc can be delivered using a heated thin film evaporator.

Table 1 summarizes the deposition conditions and the resulting film thickness for the examples. Film thickness was determined optically for examples 6–8, while chemical etching and subsequent profilometry was used for examples 1–5.

TABLE 1

| Example | % $AlCl_3$ | % EtOAc | % $O_2$ | % HF | Thickness (Å) | Growth rate (Å/s) |
| --- | --- | --- | --- | --- | --- | --- |
| 1 | 3 | 9 | 15 | 0 | 1018 | 254.5 |
| 2 | 1 | 6 | 15 | 0 | 1013 | 253.3 |
| 3 | 1 | 3 | 0 | 0 | 1285 | 321.3 |
| 4 | 3 | 6 | 7.5 | 0 | 1991 | 497.8 |
| 5 | 1 | 9 | 15 | 0 | 1017 | 254.3 |
| 6 | 7 | 9 | 0 | 0 | 1788 | 447 |
| 7 | 2 | 6 | 0 | 1.4 | 851 | 212.8 |
| 8 | 2 | 6 | 0 | 2.9 | 949 | 237.3 |

The various reactants described above are combined in the coater to deposit an aluminum oxide coating on, in examples 6–8, a clear soda-lime-silica glass sheet whereon a $SiO_2$ layer 200 Å thick had previously been deposited. Examples 1–5 were deposited on Pilkington Energy Advantage™ in which the top layer is $SnO_2$:F.

As can be seen from the information presented in Table 1, the combination of $AlCl_3$ and EtOAc without other constituents, when combined and deposited in the manner described herein, forms aluminum oxide films at useful thicknesses due to very satisfactory growth rates. Addition of molecular oxygen, in some instances, appears to greatly enhance film growth rate and film thickness.

Addition of dopants such as fluorine do not appear to enhance growth rates or film thickness, but may provide other benefits.

The uniform, gaseous reactant mixture which is delivered to the surface of the hot glass substrate in accordance with the invention preferably includes (all percentages being mole %) from about 0 to about 40% oxygen, from about 1.5% to about 25% organic ester, and from about 0.5% to about 10% aluminum halide, and most preferably includes from about 0% to about 25% oxygen, from about 3% to about 15% organic ester, and from about 1% to about 5% aluminum halide.

It has also been noted to be preferable, when forming the aluminum oxide coating in accordance with this invention, to apply a layer of a material which acts as a sodium diffusion barrier between the glass substrate and the aluminum oxide coating. Coated glass articles have been found to exhibit lower haze when the aluminum oxide coating deposited in accordance with the invention is applied to the glass with a sodium diffusion layer therebetween, as opposed to directly on the glass. This sodium diffusion layer is preferably formed of silica. The layer of silica is preferably formed using conventional CVD techniques.

In a more preferred embodiment, a thin film of tin oxide is first deposited on the surface of the hot glass substrate, with a thin film of silica deposited thereover, so that an underlayer structure of tin oxide/silica is formed intermediate the glass and the subsequently deposited layer of aluminum oxide. In this embodiment, the silica film not only acts as a sodium diffusion barrier but, in combination with the first (undoped) tin oxide film, helps to suppress iridescence in the resulting coated glass article. The use of such anti-iridescent layers is disclosed in U.S. Pat. No. 4,377,613, which is incorporated herein in its entirety by reference thereto.

It must be noted that the process conditions are not sharply critical for the successful combining and delivering of vaporized reactants according to the present invention. The process conditions described hereinabove are generally disclosed in terms which are conventional to the practice of this invention. Occasionally, however, the process conditions as described may not be precisely applicable for each compound included within the disclosed scope. Those compounds for which this occurs will be readily recognizable by those ordinarily skilled in the art. In all such cases, either the process may be successfully performed by conventional modifications known to those ordinarily skilled in the art, e.g., by increasing or decreasing temperature conditions, by varying rates of combination of the reactants, by routine modifications of the vaporization process conditions, etc., or other process conditions which are otherwise conventional will be applicable to the practice of the invention.

It will also be noted that the process of the invention may be repeated as desired on a given substrate so as to form a coating consisting of several successive layers, the composition of each layer not necessarily being identical. It is, of course, obvious that for a given flow rate of the reactants, the thickness of a coating layer depends on the rate of movement of the substrate. Under these conditions, the reaction stations may, if desired, be multiplied by juxtaposing two or more coating devices. In this way, successive layers are superimposed before the layers have had time to cool, producing a particularly homogeneous overall coating.

The invention has been disclosed in which is considered to be its preferred embodiment. It must be understood, however, the specific embodiments are provided only for the purpose of illustration, and that the invention may be practiced otherwise than as specifically illustrated without departing from its spirit and scope.

What is claimed is:

1. A chemical vapor deposition process for depositing an aluminum oxide coating on a hot glass substrate comprising:
   preparing a precursor gas mixture comprising an inorganic aluminum halide and an organic ester having a β hydrogen on the alkyl group bonded to the carboxylate oxygen;
   maintaining said precursor gas mixture at a temperature below the temperature at which the inorganic aluminum halide reacts with the ester to form an aluminum oxide coating while delivering the gaseous mixture to a coating chamber which opens onto the hot glass substrate; and
   introducing the precursor gas mixture into the coating chamber, whereby the gaseous mixture is heated to above the reaction temperature of the aluminum halide and the ester and incorporates oxygen from the ester to cause the deposition of the aluminum oxide coating.

2. The process for depositing the aluminum oxide coating on the substrate as recited in claim 1, wherein said ester is selected from the group consisting of ethyl formate, ethyl acetate, ethyl propionate, isopropyl formate, isopropyl acetate, n-butyl acetate, and t-butyl acetate.

3. The process for depositing the aluminum oxide coating on a glass substrate as recited in claim 2, wherein the ester in the precursor gas mixture is at a concentration of about 1 to 9 times the concentration of the aluminum halide.

4. The process for depositing the aluminum oxide coating on the glass substrate as recited in claim 1, wherein said inorganic aluminum halide is an inorganic aluminum chloride.

5. The process for depositing the aluminum oxide coating on the glass substrate as recited in claim 4, wherein said aluminum chloride is aluminum trichloride.

6. The process for depositing the aluminum oxide coating on the substrate as recited in claim 1, wherein the substrate is a float glass ribbon.

7. The process for depositing the aluminum oxide coating on the substrate recited in claim 6, wherein the precursor gas mixture flows over the float glass ribbon to be coated under laminar flow conditions.

8. The process for depositing the aluminum oxide coating on a substrate as recited in claim 6, wherein said float glass ribbon is at a temperature in the range of about 1100°–1320° F./590° C.–715° C.

9. The process for depositing the aluminum oxide coating on the substrate as recited in claim 1, wherein said ester having a β hydrogen is ethyl acetate and said substrate is a float glass ribbon.

10. The process for depositing the aluminum oxide coating on the substrate as recited in claim 1, wherein the substrate has a silica coating thereon, and said aluminum oxide coating is deposited over the silica coating.

11. The process for depositing the aluminum oxide coating on the glass substrate as recited in claim 1, wherein the aluminum halide in the precursor gas mixture is at a concentration of about 0.5–10% by volume.

12. The process for depositing the aluminum oxide coating on the glass substrate as recited in claim 1, wherein said aluminum oxide coating has an average refractive index of about 1.5–1.65 in the 400 to 800 nm range of the electromagnetic spectrum.

13. The process for depositing the aluminum oxide coating on the glass substrate as recited in claim 1, wherein said deposition process results in a deposition rate of 200 Å/sec. or more.

14. The process of claim 1 wherein the precursor gas mixture is further comprised of molecular oxygen.

15. An atmospheric pressure chemical vapor deposition process for depositing an aluminum oxide coating on a hot glass substrate comprising:
    preparing a precursor gas mixture comprising an inorganic aluminum halide and an organic ester having a β hydrogen on the alkyl group bonded to the carboxylate oxygen;
    maintaining said precursor gas mixture at a temperature below the temperature at which the inorganic aluminum halide reacts to form an aluminum oxide coating while delivering the gaseous mixture to a coating chamber which opens onto the hot glass substrate; and
    introducing the precursor gas mixture into the coating chamber, the coating chamber being at, essentially, atmospheric pressure, whereby the gaseous mixture is heated to a temperature above the reaction temperature of the aluminum halide and the ester, and incorporates oxygen from the ester to cause the deposition of the aluminum oxide coating.

16. The process for depositing the aluminum oxide coating on the substrate recited in claim 15, wherein the precursor gas mixture flows over the hot glass substrate to be coated under laminar flow conditions.

17. The process for depositing the aluminum oxide coating on a substrate as recited in claim 16, wherein said hot glass substrate is at a temperature in the range of about 1100°–1320° F./590° C.–715° C.

18. The process for depositing the aluminum oxide coating on the substrate as recited in claim 15, wherein said ester having a β hydrogen is ethyl acetate and said substrate is a float glass ribbon.

19. The process for depositing the aluminum oxide coating on the substrate as recited in claim 15, wherein the substrate has a silica coating thereon, and said aluminum oxide coating is deposited over the silica coating.

20. The process for depositing the aluminum oxide coating on the glass substrate as recited in claim 15, wherein the aluminum halide in the precursor gas mixture is at a concentration of about 0.5–10% by volume.

21. The process for depositing the aluminum oxide coating on the glass substrate as recited in claim 15, wherein the ester in the precursor gas mixture is at a concentration of about 1 to 9 times the concentration of the aluminum halide.

22. The process for depositing the aluminum oxide coating on the glass substrate as recited in claim 15, wherein said aluminum oxide coating has an average refractive index of about 1.5–1.65 in the 400 to 800 nm range of the electromagnetic spectrum.

23. The process for depositing the aluminum oxide coating on the glass substrate as recited in claim 15, wherein said deposition process results in a deposition rate of 200 Å/sec. or more.

24. A method of utilizing an inorganic aluminum halide and an organic ester having a β hydrogen on the alkyl group bonded to the carboxylate oxygen to form an aluminum oxide coating on a hot glass substrate by chemical vapor deposition.

* * * * *